(12) United States Patent
Burroughes et al.

(10) Patent No.: US 9,373,795 B2
(45) Date of Patent: Jun. 21, 2016

(54) ORGANIC SEMICONDUCTOR COMPOSITION INCLUDING A NON-POLYMERIC MATERIAL HAVING A POLYDISPERSITY EQUAL TO ONE, AT LEAST ONE SOLVENT, AND A CRYSTALLIZATION MODIFIER, AND AN ORGANIC THIN-FILM TRANSISTOR USING THE SAME

(75) Inventors: Jeremy Burroughes, Cambridgeshire (GB); Christopher Newsome, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 141 days.

(21) Appl. No.: 14/345,902
(22) PCT Filed: Sep. 12, 2012
(86) PCT No.: PCT/GB2012/000711
§ 371 (c)(1),
(2), (4) Date: Mar. 19, 2014
(87) PCT Pub. No.: WO2013/041822
PCT Pub. Date: Mar. 28, 2013

(65) Prior Publication Data
US 2014/0225101 A1      Aug. 14, 2014

(30) Foreign Application Priority Data
Sep. 20, 2011    (GB) .................................. 1116251.8

(51) Int. Cl.
*H01L 29/08* (2006.01)
*H01L 35/24* (2006.01)
(Continued)

(52) U.S. Cl.
CPC ........ *H01L 51/0074* (2013.01); *H01L 51/0512* (2013.01); *H01L 51/0566* (2013.01); *H01L 51/0003* (2013.01); *H01L 51/0043* (2013.01)

(58) Field of Classification Search
CPC ............ H01L 51/0074; H01L 51/0512; H01L 51/0566; H01L 51/0003; H01L 51/0043
See application file for complete search history.

(56) References Cited

U.S. PATENT DOCUMENTS

| 2005/0258417 | A1 | 11/2005 | Minakata |
| 2006/0159952 | A1 | 7/2006 | Ricks et al. |
| 2007/0178621 | A1 | 8/2007 | MacGillivray |

FOREIGN PATENT DOCUMENTS

| JP | 2008-010541 A | 1/2008 |
| JP | 2009-196975 A | 9/2009 |

(Continued)

OTHER PUBLICATIONS

Machine Translation of JP2008-010541 A; Takemura et al.; Jan. 17, 2008.*

(Continued)

*Primary Examiner* — Stephen W Smoot
*Assistant Examiner* — Vicki B Booker
(74) *Attorney, Agent, or Firm* — Marshall, Gerstein & Borun LLP

(57) ABSTRACT

An organic semiconductor composition including at least one solvent, a polymer, a first small molecule organic semiconductor and a small molecule crystallization modifier. The first small molecule organic semiconductor:small molecule crystallization modifier weight ratio is at least 6:1, optionally at least 10:1, optionally at least 20:1. The small molecule crystallization modifier increases the uniformity of the first small molecule organic semiconductor distribution in an organic semiconductor layer deposited in the channel of an organic transistor, with the effect that the mobility of the organic transistor is higher than the mobility of an organic device including a composition without the small molecule crystallization modifier.

17 Claims, 5 Drawing Sheets

(51) Int. Cl.
   *H01L 51/00*   (2006.01)
   *H01L 51/05*   (2006.01)

(56)                References Cited

FOREIGN PATENT DOCUMENTS

| JP | 2009-283786 A | 12/2009 |
|---|---|---|
| WO | WO-2005/055248 A2 | 6/2005 |
| WO | WO-2005/104265 A1 | 11/2005 |
| WO | WO-2007/082584 A1 | 7/2007 |
| WO | WO-2009/000683 A1 | 12/2008 |
| WO | WO-2011/004869 A1 | 1/2011 |

OTHER PUBLICATIONS

Chung et al, "Zone-Refinement Effect in Small Molecule-Polymer Blend Semiconductors for Organic Thin-Film Transistors," *J Am. Chem. Soc.*, 133(3):412-415 (2011).

Hamilton et al., "High-Performance Polymer-Small Molecule Blend Organic Transistors," *Adv. Mater.*, 21:1166-1171 (2009).

Kang et al., "Structure and Properties of Small Molecule-Polymer Blend Semiconductors for Organic Thin Film Transistors," *J. Am. Chem. Soc.*, 130(37):12273-12275 (2008).

Lada et al, "Morphology Control via Dual Solvent Crystallization for High-Mobility Functionalized Pentacene-Blend Thin Film Transistors," *J. Mater. Chem.*, 21(30):11232-11238 (2011).

Madec et al., "Organic Semiconductor-Polymer Insulator Blends: A Morphological Study of the Guest-Host Interactions," *J. Surf. Sci. Nanotech.*, 7:455-458 (2009).

Ohe et al., "Solution-Processed Organic Thin-Film Transistors with Vertical Nanophase Separation," *Appl. Phys. Lett.*, 93(5):053303-1-053303-3 (2008).

Okamoto et al., "General Synthesis of Thiophene and Selenophene-Based Heteroacenes," *Organic Lett.*, 7(23):5301-5304 (2005).

Podzorov et al., "Single-Crystal Organic Field Effect Transistors with the Hole Mobility ~8 $cm^2$/Vs," *Appl. Phys. Lett.*, 83(17):3504-3506 (2003).

Russell et al., "Blends of Semiconductor Polymer and Small Molecular Crystals for Improved-Performance Thin-Film Transistors," *Appl. Phys. Lett.*, 87(22):222109-1-222109-3 (2005).

Smith et al., "High-Performance Organic Integrated Circuits Based on Solution Processable Polymer-Small Molecule Blends," *Appl. Phys. Lett.*, 93(25):253301-1-253301-3 (2008).

Wu et al., "Controlled Orientation of Liquid-Crystalline Polythiophene Semiconductors for High-Performance Organic Thin-Film Transistors," *Appl. Phys. Lett.*, 86(14):142102 (2005).

Yan et al., "Organic Field-Effect Transistors Based on a Crosslinkable Polymer Blend as the Semiconducting Layer," *Appl. Phys. Lett.*, 87(18):183501 (2005).

Combined Search and Examination Report for Application No. GB1116251.8, dated Jan. 20, 2012.

International Preliminary Report on Patentability for Application No. PCT/GB2012/000711, dated Mar. 25, 2014.

International Search Report and Written Opinion for Application No. PCT/GB2012/000711, dated Apr. 12, 2012.

\* cited by examiner

ORGANIC SEMICONDUCTOR COMPOSITION INCLUDING A NON-POLYMERIC MATERIAL HAVING A POLYDISPERSITY EQUAL TO ONE, AT LEAST ONE SOLVENT, AND A CRYSTALLIZATION MODIFIER, AND AN ORGANIC THIN-FILM TRANSISTOR USING THE SAME

FIELD OF THE INVENTION

The present invention relates to an organic semiconductor composition. It also relates to organic thin-film transistors and methods of making them, in particular for controlling organic semiconductor crystallinity.

BACKGROUND OF THE INVENTION

Transistors can be divided into two main types: bipolar junction transistors and field-effect transistors. Both types share a common structure comprising three electrodes with a semiconductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semiconductive material which conducts positive charge carriers (holes) or negative charge carriers (electrons) respectively. The semiconductive material may be selected according to its ability to accept, conduct, and donate charge. The ability of the semiconductive material to accept, conduct, and donate holes or electrons can be enhanced by doping the material. The material used for the source and drain electrodes can also be selected according to its ability to accept and inject holes or electrons. For example, a p-type transistor device can be formed by selecting a semiconductive material which is efficient at accepting, conducting, and donating holes, and selecting a material for the source and drain electrodes which is efficient at injecting and accepting holes from the semiconductive material. Good energy-level matching of the Fermi-level in the electrodes with the HOMO (Highest Occupied Molecular Orbital) level of the semiconductive material can enhance hole injection and acceptance. In contrast, an n-type transistor device can be formed by selecting a semiconductive material which is efficient at accepting, conducting, and donating electrons, and selecting a material for the source and drain electrodes which is efficient at injecting electrons into, and accepting electrons from, the semiconductive material. Good energy-level matching of the Fermi-level in the electrodes with the LUMO (Lowest Unoccupied Molecular Orbital) level of the semiconductive material can enhance electron injection and acceptance.

Transistors can be formed by depositing the components in thin films to form thin-film transistors. When an organic material is used as the semiconductive material in such a device, it is known as an organic thin-film transistor (OTFT).

Various arrangements for OTFTs are known. One such device is an insulated gate field-effect transistor which comprises source and drain electrodes with a semiconductive material disposed therebetween in a channel region, a gate electrode disposed over the semiconductive material and a layer of insulting material disposed between the gate electrode and the semiconductive material in the channel region.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (the channel region between the source and drain electrodes). Thus, in order to achieve high drain currents with low operational voltages, organic thin-film transistors must have an organic semiconductor which has highly mobile charge carriers in the channel region.

High mobility OTFTs containing "small molecule" organic semiconductor materials have been reported, and the high mobility has been attributed, at least in part, to the highly crystalline nature of the small molecule organic semiconductors in the OTFT. Particularly high mobilities have been reported in single crystal OTFTs wherein the organic semiconductor is deposited by thermal evaporation. A single crystal OTFT is disclosed in Podzorov et al, Appl. Phys. Lett. 2003, 83(17), 3504-3506.

Formation of the semiconductor region by solution deposition of a blend of a small molecule organic semiconductor and a polymer is disclosed in Smith et. al., Applied Physics Letters, Vol 93, 253301 (2008); Russell et. al., Applied Physics Letters, Vol 87, 222109 (2005); Ohe et. al., Applied Physics Letters, Vol 93, 053303 (2008); Madec et. al., Journal of Surface Science & Nanotechnology, Vol 7, 455-458 (2009); Kang et. al., J. Am. Chem. Soc., Vol 130, 12273-75 (2008); Chung et al, J. Am. Chem. Soc. (2011), 133(3), 412-415; Lada et al, J. Mater. Chem. (2011), 21(30), 11232-11238; Hamilton et al, Adv. Mater. (2009), 21(10-11), 1166-1171; and WO 2005/055248.

Reducing contact resistance at the source and drain electrodes is disclosed in WO 2009/000683 by selectively forming a self-assembled layer of a dopant for the organic semiconductor on the surface of the source and drain electrodes.

SUMMARY OF THE INVENTION

In a first aspect, the invention provides a composition comprising at least one solvent, a first small molecule organic semiconductor and a small molecule crystallisation modifier.

Optionally, the composition further comprises a polymer.

Optionally, the polymer is an at least partially conjugated polymer.

Optionally, the polymer comprises a repeat unit of formula (XI):

wherein $Ar^1$ and $Ar^2$ in each occurrence are independently selected from substituted or unsubstituted aryl or heteroaryl groups, n is greater than or equal to 1, preferably 1 or 2, R in each occurrence is H or a substituent, preferably a substituent, and x and y are each independently 1, 2 or 3.

Optionally, the polymer comprises a repeat unit of formula (XII):

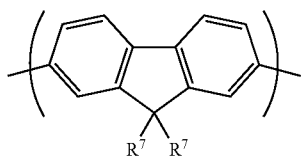

wherein the two groups $R^7$, which may be the same or different, are each H or a substituent and wherein the two groups $R^7$ may be linked to form a ring.

Optionally, the polymer:(first small molecule organic semiconductor+small molecule crystallisation modifier) weight ratio is at least 1:10, optionally at least 1:6, optionally at least 1:4, optionally at least 1:2, optionally at least 1:1, optionally at least 2:1, optionally at least 3:1.

Optionally, the small molecule first organic semiconductor is a compound comprising a core group of at least three fused rings wherein each said fused ring is independently an aromatic or heteroaromatic ring and wherein the core group is substituted with at least one substituent.

Optionally, the first small molecule organic semiconductor is selected from compounds of formulae (I)-(V):

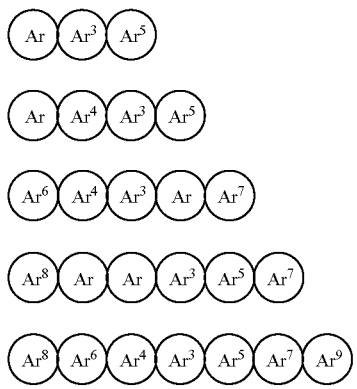

wherein $Ar^3$, $Ar^4$, $Ar^5$, $Ar^6$, $Ar^7$, $Ar^8$ and $Ar^9$ are each independently selected from the group consisting of monocyclic aromatic rings and monocyclic heteroaromatic rings, and at least one of $Ar^3$, $Ar^4$, $Ar^5$, $Ar^6$, $Ar^7$, $Ar^8$ and $Ar^9$ is substituted with at least one substituent X, which in each occurrence may be the same or different and is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups that may be unsubstituted or substituted with one, two or three alkyl groups having from 1 to 8 carbon atoms, silylethynyl groups that may be unsubstituted or substituted with one, two or three alkyl groups having from 1 to 8 carbon atoms and alkenyl groups having from 2 to 12 carbon atoms and wherein $Ar^3$, $Ar^4$ and $Ar^5$ may each optionally be fused to one or more further monocyclic aromatic or heteroaromatic rings.

Optionally, at least one of $Ar^3$, $Ar^4$, $Ar^5$, $Ar^6$, $Ar^7$, $Ar^8$ and $Ar^9$ comprises a 5- to 7-membered heteroaryl group containing from 1 to 3 sulfur atoms, oxygen atoms, selenium atoms and/or nitrogen atoms Optionally, $Ar^3$, $Ar^4$, $Ar^5$, $Ar^6$, $Ar^7$, $Ar^8$ and $Ar^9$ are each independently selected from phenyl and thiophene and wherein at least one of $Ar^3$, $Ar^4$, $Ar^5$, $Ar^6$, $Ar^7$, $Ar^8$ and $Ar^9$ is thiophene.

Optionally, the first small molecule organic semiconductor has formula (X):

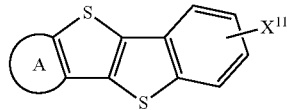

wherein A is a phenyl group or a thiophene group, said phenyl group or thiophene group optionally being fused with a phenyl group or a thiophene group which can optionally be fused with a group selected from a phenyl group, a thiophene group and a benzothiophene group, any of said phenyl, thiophene and benzothiphene groups being unsubstituted or substituted with at least one group of formula $X^{11}$; and each group $X^{11}$ may be the same or different and is selected from substituents X according to claim 8, preferably a group of formula $C_nH_{2n+1}$ wherein n is an integer of from 1 to 20.

Optionally, the core of the first small molecule organic semiconductor is a hydrocarbyl group formed from at least 3 fused benzene rings.

Optionally, the first small molecule organic semiconductor is pentacene substituted with one or more tri($C_{1-10}$ alkyl) silylethynyl substituents.

Optionally, the small molecule crystallization modifier is a second small molecule organic semiconductor.

Optionally, the small molecule crystallisation modifier is selected from compounds according to claim 7-13 and is different from the first small molecule organic semiconductor.

Optionally, the small molecule crystallisation modifier is a compound having the same core as the first small molecule organic semiconductor and wherein one or more of the at least one substituent, substituent position and number of substituents of the small molecule crystallisation modifier differs from the at least one substituent, substituent position and number of substituents of the first small molecule organic semiconductor.

Optionally, the first small molecule organic semiconductor:small molecule crystallisation modifier weight ratio is at least 2:1, optionally at least 5:1.

Optionally, the at least one solvent is a benzene or fused benzene substituted with one or more substituents selected from alkyl and alkoxy substituents.

In a second aspect the invention provides a method of forming an organic thin-film transistor comprising a source electrode and a drain electrode defining a channel region therebetween; an organic semiconductor layer extending across the channel region and in electrical contact with the source and drain electrodes; a gate electrode; and a gate dielectric between the gate electrode and the organic semiconductor layer, the method comprising the step of forming the organic semiconductor layer of the organic thin-film transistor by depositing a composition according to the first aspect and evaporating the at least one solvent.

Optionally, the method comprises the step of modifying at least part of the surface of the source and drain electrodes prior to deposition of the composition.

Optionally, the modifying step comprises binding an organic material to at least part of the surface of the source and drain electrodes.

Optionally, the organic material has formula (XIII):

Bind-(Sp)z-Org                                    (XIII)

wherein Bind represents a binding group; Sp represents a spacer group, optionally an alkyl group or aryl group; z is 0 or 1; and Org is an organic group.

Optionally, Org is a conjugated group, optionally benzene substituted with one or more fluorine atoms.

Optionally, Bind is a thiol.

Optionally, z is 0.

Optionally, the method comprises the step of binding a silane to a surface of a channel between the source and drain electrodes prior to deposition of the composition.

Optionally, a thickness of the organic semiconductor layer has a thickness variation between a thinnest part and a thickest part of the layer of no more than 100 nm.

Optionally, the thickness of the organic semiconductor layer does not exceed 100 nm.

Optionally, the organic thin-film transistor is a top-gate organic thin film transistor, the method comprising the steps of forming the organic semiconductor layer and depositing the gate dielectric and gate electrode over the organic semiconductor layer.

Optionally, the organic thin-film transistor is a bottom-gate organic thin-film transistor.

In a third aspect, the invention provides an organic thin-film transistor comprising a source electrode and a drain electrode defining a channel region therebetween, an organic semiconductor layer extending across the channel region and in electrical contact with the source and drain electrodes; a gate electrode; and a gate dielectric between the gate electrode and the organic semiconductor layer, wherein the organic semiconductor layer comprises a first small molecule organic semiconductor and a small molecule crystallisation modifier.

Optionally according to the third aspect, the organic semiconductor layer further comprises a polymer, optionally a polymer as described in the first aspect.

Optionally according to the third aspect, the small molecule organic semiconductor is as described in the first aspect.

Optionally according to the third aspect, the small molecule crystallisation modifier is as described in the first aspect.

Optionally according to the third aspect, an organic material is bound to at least part of the surface of the source and drain electrodes.

Optionally according to the third aspect, the organic material is as described in the second aspect.

Optionally according to the third aspect, a silane is bound to a surface of the channel region.

"Small molecule" as used herein means a non-polymeric material, in particular a material having a polydispersity of 1, and includes dendrimeric or oligomeric compounds having a polydispersity of 1. In the case of an oligomer, the small molecule may be a dimer, a trimer, a tetramer or a pentamer.

DESCRIPTION OF THE FIGURES

The invention will now be described in more detail with reference to the Figures, in which.

DETAILED DESCRIPTION OF THE INVENTION

Figure 1:
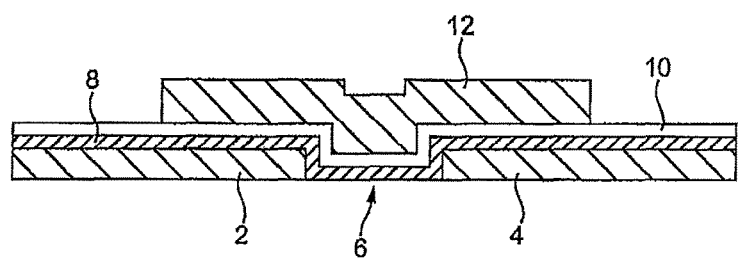
FIG. 1 is a schematic illustration of a top-gate transistor according to an embodiment of the invention.

FIG. 1, which is not drawn to any scale, schematically illustrates an exemplary top-gate organic thin-film transistor. The illustrated structure may be deposited on a substrate (not shown) and comprises source and drain electrodes 2, 4 which are spaced apart with a channel region 6 located therebetween. An organic semiconductor layer 8 in the channel region 6 contacts the source and drain electrodes 2, 4 and may extend over at least a portion of the source and drain electrodes 2, 4. An insulating layer 10 of dielectric material is deposited over the organic semiconductor layer 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin-film transistor as the gate is located on a top side of the device relative to a substrate. Alternatively, it is also known to provide the gate on a bottom side of the device to form a so-called bottom-gate organic thin-film transistor.

Figure 2:
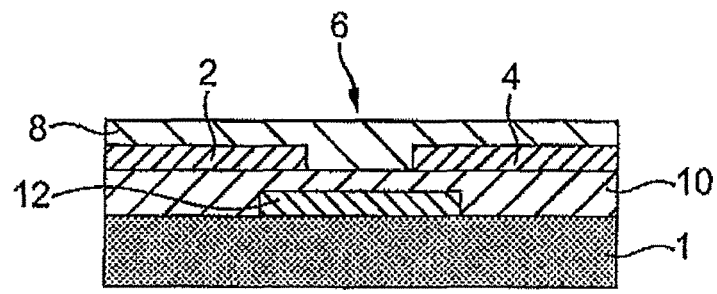
FIG. 2 is a schematic illustration of a bottom-gate transistor according to an embodiment of the invention.

An example of a bottom-gate organic thin-film transistor is shown in FIG. 2, which is not drawn to any scale. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor layer 8 in the channel region 6 contacts source and drain electrodes 2, 4 and may extend over at least a portion of the source and drain electrodes 2, 4.

Small Molecule Organic Semiconductor

Exemplary small molecule organic semiconductors include compounds having a core of at least three fused rings wherein each ring is independently selected from aromatic rings and heteroaromatic rings that are each individually unsubstituted or substituted with one or more substituents. Preferably, the core is substituted with at least one substituent, optionally with one or more solubilising substituents.

Solubilising substituents may be substituents that increase solubility of the organic semiconductor in an organic solvent, for example a non-polar organic solvent, as compared to an unsubstituted organic semiconductor.

Exemplary substituents include substituents X described with reference to Formulae (I)-(V), for example one or more alkyl groups, alkoxy groups or silyl groups, including trialkylsilyl and trialkylsilylethynyl.

The small molecule organic semiconductor may be an electron-rich compound, for example a compound comprising fused thiophene repeat units.

Exemplary small molecule organic semiconductors include compounds of formulae (I)-(V).

The small molecule organic semiconductor may be selected from compounds of formulae (VI), (VII), (VIII), (IX) and (X):

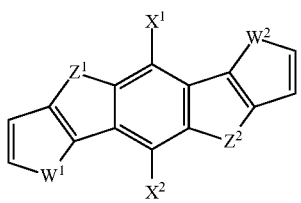
(VI)

wherein $X^1$ and $X^2$ may be the same or different and are selected from substituents X as described above with reference to formulae (I)-(V); $Z^1$ and $Z^2$ are independently S, O, Se or $NR^4$; and $W^1$ and $W^2$ are independently S, O, Se, $NR^4$ or $-CR^4=CR^4-$, where $R^4$ is H or a substituent selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms;

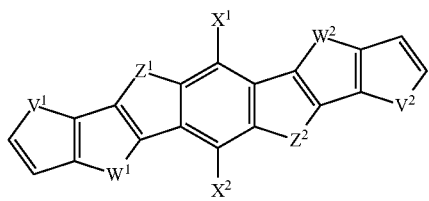
(VII)

wherein $X^1$ and $X^2$ are as described with reference to formula (VI), $Z^1$, $Z^2$, $W^1$ and $W^2$ are as described with reference to formula (VI) and $V^1$ and $V^2$ are independently S, O, Se or $NR^5$ wherein $R^5$ is H or a substituent selected from the group consisting of substituted or unsubstituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms;

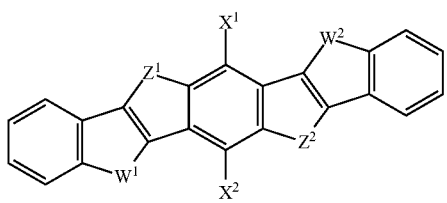
(VIII)

wherein $X^1$ and $X^2$, $Z^1$, $Z^2$, $W^1$ and $W^2$ are as described with reference to formula (VI).

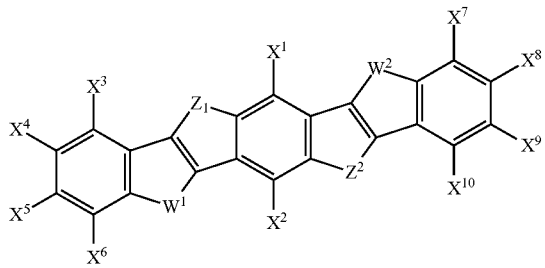
(IX)

wherein $Z^1$, $Z^2$, $W^1$ and $W^2$ are as described with reference to formula (VI) and $X^1$-$X^{10}$, which may be the same or different, are selected from substituents X as described with reference to formulae (I)-(V);

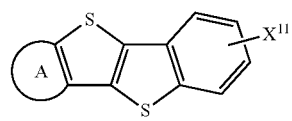
(X)

wherein A is a phenyl group or a thiophene group, said phenyl group or thiophene group optionally being fused with a phenyl group or a thiophene group which can optionally be fused with a group selected from a phenyl group, a thiophene group and a benzothiophene group, any of said phenyl, thiophene and benzothiphene groups being unsubstituted or substituted with at least one group of formula $X^{11}$; and each group $X^{11}$ may be the same or different and is selected from substituents X as described with reference to formulae (I)-(V), and preferably is a group of formula $C_nH_{2n+1}$ wherein n is an integer of from 1 to 20.

In the compound of formula (X), A is optionally selected from:

a thiophene group that is fused with a phenyl group substituted with at least one group of formula $X^{11}$; or a phenyl group that may be unsubstituted or substituted with at least one group of formula $X^{11}$, said phenyl group further optionally being fused with a thiophene group which can be unsubstituted or substituted with at least one group of formula $X^{11}$ and/or fused with a benzothiophene group, said benzothiphene group being unsubstituted or substituted with at least one group of formula $X^{11}$, wherein $X^{11}$ is a group of formula $C_nH_{2n+1}$ wherein n is an integer of from 1 to 16.

Compounds of formula (X) include the following:

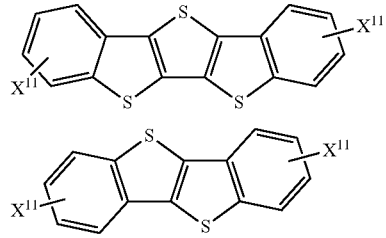

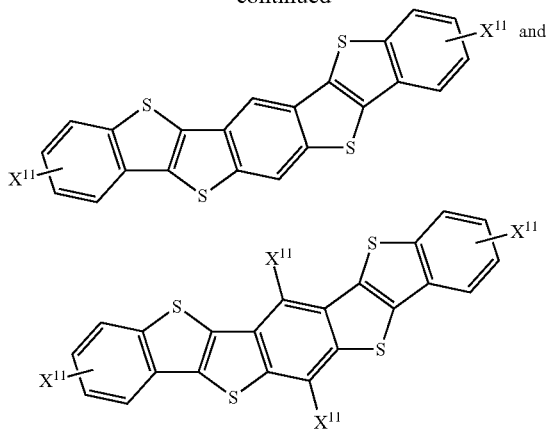

wherein $X^{11}$ is a group of formula $C_nH_{2n+1}$ wherein n is an integer of from 1 to 16.

A preferred compound of formula (III) is pentacene substituted with one or more tri($C_{1-10}$ alkyl)silylethynyl groups. Preferably, a tri($C_{1-10}$ alkyl)silylethynyl substituent is provided in the 6- and 13-positions of pentacene. An exemplary substituted pentacene is 6,13-(tri-isopropyl-silylethynyl)pentacene ("TIPS pentacene"):

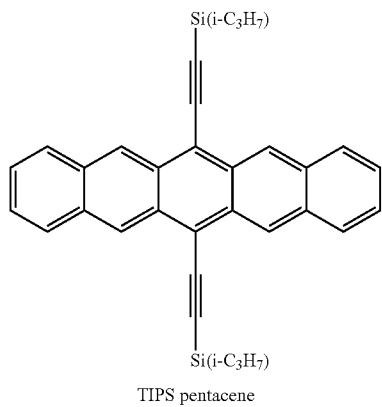

TIPS pentacene

The one or more substituents of the small molecule organic semiconductor, for example substituents X and $X^1$-$X^{11}$ as described above, may be provided on: (a) one or both of the monocyclic aromatic or heteroaromatic rings at the end(s) of the organic semiconductor core; (b) on one or more of the monocyclic aromatic or heteroaromatic ring or rings that are not at the ends of the organic semiconductor core; or on both of (a) and (b).

Small Molecule Crystallisation Modifier

The small molecule crystallisation modifier may increase uniformity of the small molecule organic semiconductor distribution in the organic semiconductor layer as compared to a device in which the crystallisation modifier is not present. If a composition without a crystallisation modifier is deposited onto a surface having different surface areas then crystallisation of the small molecule organic semiconductor may be concentrated in one or some of those areas, leaving one or more other areas in which little or no crystallisation takes place, resulting in a film having areas of high and low small molecule organic semiconductor concentration. The difference between different surface areas may be one or more of a difference in surface materials, a difference in surface treatments and a difference in surface energies.

In the case of deposition of the composition onto source and drain electrodes and a channel (in which the source and drain electrodes and/or the channel may or may not have undergone surface modification treatment), the crystallisation modifier may cause the small molecule organic semiconductor to crystallise to produce an organic semiconductor layer in which small molecule organic semiconductor crystals extend across substantially the entire length of the channel between the source and drain electrodes, and preferably over the source and drain electrodes.

In the absence of a crystallisation modifier, the small molecule organic semiconductor may crystallise in a vertical direction, resulting in an organic semiconductor film of non-uniform thickness in which small molecule organic semiconductor crystals do not extend across substantially the entire length of the channel. The crystallisation modifier may increase uniformity of the organic semiconductor layer film thickness.

The crystallisation modifier may reduce the energetic favourability of large crystal growth centred on one or a small number of nucleation sites, with the effect that the crystalline small molecule organic semiconductor material may further extend laterally into the channel region and consequently more evenly distributed within the channel, and optionally over the source and drain electrodes, as compared to an organic semiconductor film formed by depositing a composition in which the crystallisation modifier is absent. This may provide a channel with a narrower distribution of mobility across different areas within the channel as compared to a device in which crystal growth has not been inhibited.

The small molecule crystallisation modifier may be selected from the small molecule organic semiconductors described above, for example small molecule organic semiconductors according to any of formulae (I)-(X), provided that the crystallisation modifier of the inventive composition, and of the resultant device, is structurally different from the organic semiconductor.

The small molecule crystallisation modifier may have the same core as the small molecule organic semiconductor but at least one different substituent. For example, the crystallisation modifier and organic semiconductor may have the same core selected from cores of formulae (I)-(X) but different substitution. The difference in substitution may be one or more of: a difference in one or more of substituents X and $X^1$-$X^{11}$; a difference in the substitution position; and a difference in the number of substituents. In one preferred arrangement, the substituents are different. For example, the small molecule organic semiconductor may have a core that is substituted in one or more positions with a $C_{1-20}$ alkyl group, and the small molecule crystallisation modifier may have the same core substituted in the same position or positions, but wherein at least one substituent of the crystallisation modifier is a $C_{1-20}$ alkyl group that is different from the $C_{1-20}$ alkyl group in the corresponding position of the organic semiconductor.

The small molecule crystallisation modifier may have a different core to the small molecule organic semiconductor but the same substituents. In this case, the organic semiconductor and the crystallisation modifier may be compounds of formulae (I)-(X).

The small molecule crystallisation modifier and the small molecule organic semiconductor may have a different core and different substituents. In this case, the organic semiconductor and the crystallisation modifier may each be selected from compounds of formulae (I)-(X) wherein both the core and the substitution of the organic semiconductor and the crystallisation modifier are different.

In one preferred embodiment, the small molecule organic semiconductor and small molecule crystallisation modifier are both compounds of formula (X), and may both be a compound having the following formula, wherein at least one substituent $X^{11}$ and/or $X^{11}$ substitution position is different between the organic semiconductor and crystallisation modifier:

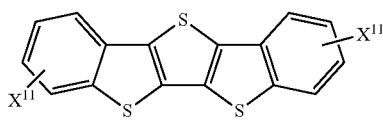

wherein $X^{11}$ is a group of formula $C_nH_{2n+1}$ wherein n is an integer of from 1 to 16.

The small molecule organic semiconductor:small molecule crystallisation modifier weight ratio is optionally at least 2:1, optionally at least 5:1, optionally at least 10:1 and optionally at least 20:1.

The composition may consist essentially of small molecules, and may consist essentially of the small molecule organic semiconductor and the small molecule crystallisation modifier. In other arrangements, one or more polymers may be present in the composition.

Polymer

The polymer, where present, may be any soluble polymer including non-conducting and semiconducting polymers.

Exemplary non-conducting polymers include polystyrenes and polyacrylates, for example PMMA.

Preferred semiconducting polymers have a polymer backbone comprising repeat units that are conjugated to one another.

Exemplary repeat units of a conjugated polymer include (hetero)arylene repeat units, (hetero)arylenevinylene repeat units and (hetero)arylamine repeat units.

Exemplary (hetero)arylamine repeat units include repeat units of formula (XI):

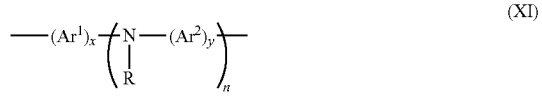

wherein $Ar^1$ and $Ar^2$ in each occurrence are independently selected from substituted or unsubstituted aryl or heteroaryl groups, n is greater than or equal to 1, preferably 1 or 2, R in each occurrence is H or a substituent, preferably a substituent, and x and y are each independently 1, 2 or 3.

Exemplary groups R include alkyl and aryl, for example phenyl.

Any of $Ar^1$, $Ar^2$ and R in the case where R is aryl may independently be substituted with one or more substituents. Preferred substituents are selected from the group $R^3$ consisting of:

alkyl wherein one or more non-adjacent C atoms may be replaced with O, S, substituted N, C=O and —COO— and one or more H atoms of the alkyl group may be replaced with F or aryl or heteroaryl substituted or unsubstituted with one or more groups $R^6$, aryl or heteroaryl substituted or unsubstituted with one or more groups $R^6$, $NR^5{}_2$, $OR^5$, $SR^5$, fluorine, nitro and cyano;

wherein each $R^6$ is independently alkyl in which one or more non-adjacent C atoms may be replaced with O, S, substituted N, C=O and —COO— and one or more H atoms of the alkyl group may be replaced with F, and each $R^5$ is independently selected from the group consisting of alkyl and aryl or heteroaryl substituted or unsubstituted with one or more alkyl groups.

Preferably, x, y and n are all 1.

Preferably, $Ar^1$, $Ar^2$ and R are each phenyl and are each independently substituted or unsubstituted with one or more $C_{1-20}$ alkyl groups. In one preferred arrangement, $Ar^1$ and $Ar^2$ are unsubstituted phenyl and R is phenyl substituted with one or more $C_{1-20}$ alkyl groups.

Exemplary arylene repeat units include phenylene, fluorene, and indenofluorene repeat units, each of which may be substituted with one or more substituents.

Exemplary fluorene repeat units, include repeat units of formula (XII):

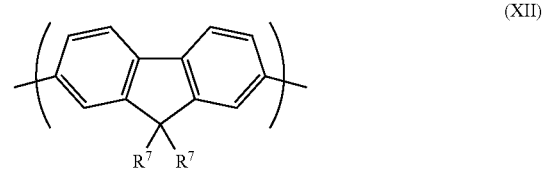

wherein the two groups $R^7$, which may be the same or different, are each H or a substituent and wherein the two groups $R^7$ may be linked to form a ring.

Each $R^7$ is optionally selected from the group consisting of hydrogen; substituted or unsubstituted aryl or heteroaryl, preferably substituted or unsubstituted phenyl; and substituted or unsubstituted alkyl wherein one or more non-adjacent C atoms of the alkyl group may be replaced with O, S, substituted N, C=O and —COO—.

In the case where $R^7$ comprises alkyl, optional substituents of the alkyl group include F, cyano, nitro, and aryl or heteroaryl substituted or unsubstituted with one or more groups $R^6$ wherein $R^6$ is as described above.

In the case where $R^7$ comprises aryl or heteroaryl, each aryl or heteroaryl group may independently be substituted. Preferred optional substituents for the aryl or heteroaryl groups include $C_{1-20}$ alkyl.

Optional substituents for the fluorene unit, other than substituents $R^7$, are preferably selected from the group consisting of alkyl wherein one or more non-adjacent C atoms may be replaced with O, S, substituted N, C=O and —COO—; substituted or unsubstituted aryl, for example phenyl substituted or unsubstituted with one or more alkyl groups; substituted or unsubstituted heteroaryl; fluorine, cyano and nitro.

Where present, substituted N in repeat units of formula (XII) may independently in each occurrence be $NR^5$ as described with reference to formula (XI).

In one preferred arrangement, $R^7$ in one or both occurrences is selected from a substituted or unsubstituted $C_1$-$C_{20}$ alkyl or a substituted or unsubstituted aryl group, in particular phenyl substituted with one or more $C_{1-20}$ alkyl groups.

In one preferred embodiment, the polymer is a 1:1 copolymer of a repeat unit of formula (XI) and a repeat unit of formula (XII).

Solvents

Exemplary solvents for dissolution of the small molecule organic semiconductor, the small molecule crystallisation modifier and (where present) the polymer include benzene or fused benzenes, each of which may be substituted with one or more substituents. Fused benzenes include compounds having a saturated ring and an unsaturated ring fused to benzene, for example tetralin (1,2,3,4-tetrahydronaphthalene) and indane (2,3-dihydroindene).

The one or more substituents for benzene or fused benzenes may be selected from the group of alkyl and alkoxy substitutents, optionally $C_{1-10}$ alkyl and $C_{1-10}$ alkoxy substituents, preferably $C_{1-5}$ alkyl and $C_{1-5}$ alkoxy. Exemplary solvents include xylenes; anisole substituted with one or more $C_{1-5}$ alkyl groups; methylnaphthalene; methoxynaphthalene.

The solvent may have a boiling point in the range of 60-240° C. The improved uniformity of the organic semiconductor layer film that results from the presence of the small molecule crystallisation modifier in the inventive composition means that the solvent need not evaporate rapidly. Accordingly, the composition may include a solvent having a boiling point of at least 100° C.

Solution Processing

Suitable methods for depositing the inventive compositions in order to form organic semiconductor films include coating methods, in which an entire surface is coated indiscriminately, and printing processes wherein the composition is selectively deposited on some but not all of a surface.

Exemplary coating processes include spin coating, dip-coating, slot die coating and doctor blade coating.

Exemplary printing processes include inkjet printing, flexographic printing and gravure printing.

Following deposition, the solvent may be allowed to evaporate in ambient conditions. Alternatively, the solvent may be evaporated at elevated temperature, for example at least 50° C., and/or at reduced pressure.

Source, Drain and Gate Electrodes

The source, drain and gate electrodes can be selected from a wide range of conducting materials for example a metal (e.g. gold), metal alloy, metal compound (e.g. indium tin oxide) or conductive polymer.

Thicknesses of the gate electrode, source and drain electrodes may be in the region of 5-200 nm as measured by Atomic Force Microscopy (AFM).

Gate Insulating Layer

The gate insulating layer comprises a dielectric material selected from insulating materials having a high resistivity. The dielectric constant, k, of the gate dielectric is typically around 2-3 although materials with a high value of k are desirable because the capacitance that is achievable for an OTFT is directly proportional to k, and the drain current is directly proportional to the capacitance. Thus, in order to achieve high drain currents with low operational voltages, OTFTs with thin dielectric layers in the channel region are preferred. The thickness of the insulating layer is preferably less than 2 micrometers, more preferably less than 500 nm.

The gate dielectric material may be organic or inorganic. Preferred inorganic materials include $SiO_2$, $Si_xN_y$, silicon oxynitride and spin-on-glass (SOG). Organic dielectric materials include fluorinated polymers such as polytetrafluoroethylene (PTFE), perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, Perfluoropolyether (PFPE) and a polymer of tetrafluoroethylene, hexafluoropropylene and vinylidene fluoride (THV).

Non-fluorinated organic polymer insulator materials may also be used and include polymers such as poly vinylalcohol (PVA), polyvinylpyrrolidone, polyvinylphenol, acrylates such as polymethylmethacrylate (PMMA) and benzocyclobutanes (BCBs) available from Dow Corning. The insulating layer may be formed from a blend of materials. A multi-layered structure may be used in place of a single insulating layer.

The gate dielectric material may be deposited by thermal evaporation under vacuum or by lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor layer, it should not result in dissolution of the organic semiconductor layer. Likewise, the dielectric material should not be dissolved if the organic semiconductor layer is deposited onto it from solution. Techniques to avoid such dissolution include: use of orthogonal solvents, that is use of a solvent for deposition of the uppermost layer that does not dissolve the underlying layer; and crosslinking of the underlying layer.

Further Layers

Other layers may be included in the device architecture, for example in order to reduce contact resistance and promote adhesion.

The surface of the channel region (that is, the region between the source and drain electrodes) may be provided with a monolayer comprising a material comprising a binding group and an organic group. Exemplary materials for such a monolayer include silanes, chloro- or alkoxy-silanes, for example a trichlorosilane substituted with a hydrocarbyl group selected from $C_{1-20}$ alkyl, phenyl and phenyl-$C_{1-20}$alkyl.

The source and drain electrodes may be subjected to a surface modification treatment, for example to reduce contact resistance at the interface source-drain electrode/organic semiconductor layer. The surface modification treatment may result in alteration of the workfunction of the source and drain electrodes.

The source and drain electrodes may be provided with a surface-modifying compound covering at least some of the source and drain electrode surface in contact with the organic semiconductor layer. The surface-modifying compound may reduce contact resistance between the organic semiconductor and the electrodes. Exemplary surface-modifying compounds may have a non-conjugated organic group, for example an alkyl group, and/or a conjugated organic group, for example fluorinated benzenes such as pentaphenylbenzene, and organic compounds capable of doping the organic semiconductor. Exemplary dopants include charge-neutral dopants, for example substituted or unsubstituted tetracyanoquinodimethane (TCNQ). An exemplary substituted TCNQ is tetrafluorotetracyanoquinodimethane (F4TCNQ).

Electron deficient surface modifying compounds, for example mono- or poly-fluorinated aromatics, may be particularly suitable for use with electron rich organic semiconductors, for example organic semiconductors comprising one or more thiophene rings.

The surface-modifying compound may comprise a binding group for binding to the surface of the source and drain electrodes. An exemplary binding group is thiol, which is suitable for binding to metals such as gold.

The surface-modifying compound may form a self-assembled monolayer on the surface of the source and drain electrodes.

The surface of the source and drain electrodes may be modified to provide a modified inorganic surface of the source and drain electrodes. For example, a metal oxide may be provided at the surface of the source and drain electrodes by deposition of a metal oxide layer or by oxidation of the surface of metal source and drain electrodes.

If the surface of the source and drain electrodes is at least partially covered then it will be appreciated that the organic semiconductor layer may not directly contact the material of the source and drain electrodes, but will be in electrical contact with the source and drain electrodes.

A material for modifying the surface of the channel region may selectively bind to the channel region such that the material may be applied over the channel and source and drain electrodes, and material deposited over the source and drain electrodes may be removed by washing with a suitable solvent.

Likewise, a material for modifying the surface of the source and drain electrodes may selectively bind to the source and drain electrodes such that the material may be applied over the channel and source and drain electrodes, and material deposited over the channel may be removed by washing with a suitable solvent.

EXAMPLES

Composition Examples

Polymer 1, Small Molecule Organic Semiconductor 1 and Small Molecule Crystallisation modifier 1, illustrated below, were dissolved in ortho-xylene in differing Organic Semiconductor:Crystallisation modifier ratios to give Composition Examples 1, 2 and 3.

The composition concentration was 12 mg solid per 1 ml of solvent.

| Composition Example | Polymer 1 (weight %) | Organic Semiconductor 1 (weight %) | Crystallisation modifier 1 (weight %) | Organic Semiconductor: Crystallisation modifier ratio |
|---|---|---|---|---|
| 1 | 75 | 21.43 | 3.57 | 6:1 |
| 2 | 75 | 22.73 | 2.27 | 10:1 |
| 3 | 75 | 23.81 | 1.19 | 20:1 |
| Comparative | 75 | 25 | 0 | — |

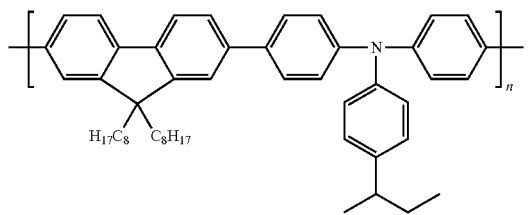

Polymer 1

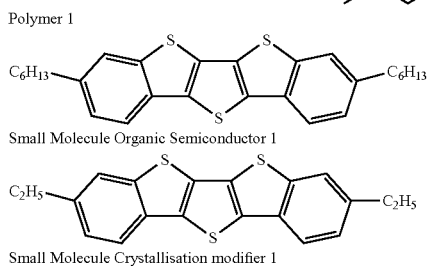

Small Molecule Organic Semiconductor 1

Small Molecule Crystallisation modifier 1

Device Example 1

Source and drain electrodes were formed on a glass substrate by patterning a photoresist layer and thermally evaporating a 5 nm adhesion layer of chrome and a 40 nm layer of gold. The Cr/Au bilayer was formed by removal of the photoresist layer to give source and drain electrodes defining a channel length of 10 microns. The surface of the source and drain electrodes was cleaned using oxygen plasma to remove residual photoresist.

The substrate carrying the source and drain electrodes was flooded in a 50 mM solution of pentafluorobenzenethiol in isopropanol for 2 minutes to form a self-assembled monolayer on the surface of the source and drain electrodes. The solution was removed by spinning the substrate on a spin coater and then rinsing it with isopropanol. All of these steps were performed in air. Samples were then transported to a dry nitrogen environment and baked at 60° C. for 10 minutes to ensure the samples were dehydrated.

Composition Example 1 was deposited onto the source and drain electrodes and the channel region by spin-coating followed by evaporation of the solvent to form an organic semiconductor layer 80 nm thick. A 350 nm thick PTFE dielectric layer was deposited onto the organic semiconductor layer by spin-coating, and a 250 nm gate electrode was formed on the gate dielectric layer by thermal evaporation.

Device Examples 2 and 3

Device Examples 2 and 3 were formed as described in Device Example 1 except that the organic semiconductor layer was formed by spin-coating Composition Examples 2 and 3 respectively.

Comparative Device 1

For the purpose of comparison, a device was prepared as described in Device Example 1 except that the Comparative Composition was used to form the organic semiconductor layer.

Further devices having channel lengths of 5, 20, 30, 50 and 100 microns were formed using Composition Examples 1, 2 and 3 and the Comparative Composition. A number of devices were made for each combination of channel length and composition.

Average peak saturation mobility was calculated for each combination of channel length and composition. The mobility of an organic thin-film transistor is a gate-bias dependent parameter. Therefore the peak saturation mobility of each device is the maximum mobility calculated at the maximum applied gate bias (with respect to the source contact) of −40V.

Figure 3:
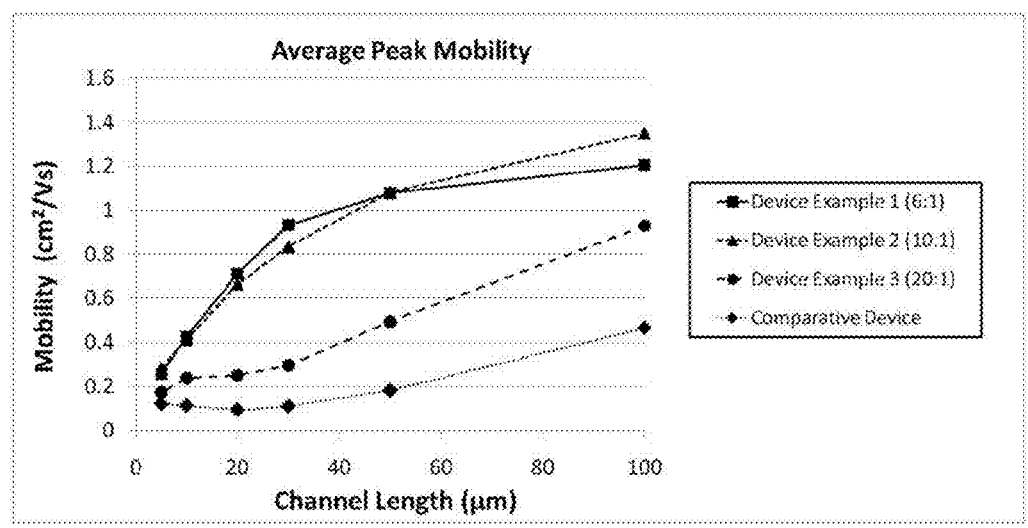
FIG. 3 is a graph of mobilities for exemplary devices and a comparative device.

As shown in FIG. 3, every Exemplary Device has a higher average peak saturation mobility than the corresponding Comparative Device.

Figure 4:
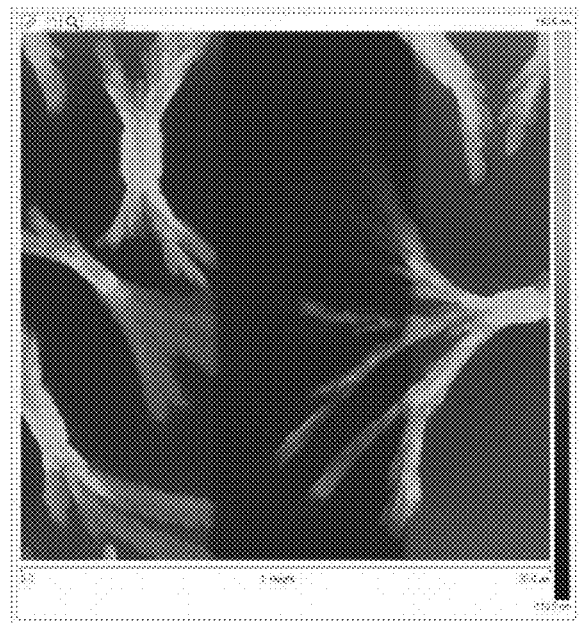
FIG. 4 is an Atomic Force Microscopy image of the organic semiconductor layer of a Comparative Device.

With reference to the AFM image of Comparative Device 1 in FIG. 4, large crystals of the small molecule organic semiconductor are visible, the crystals being centred over the source and drain electrodes.

Figure 6:
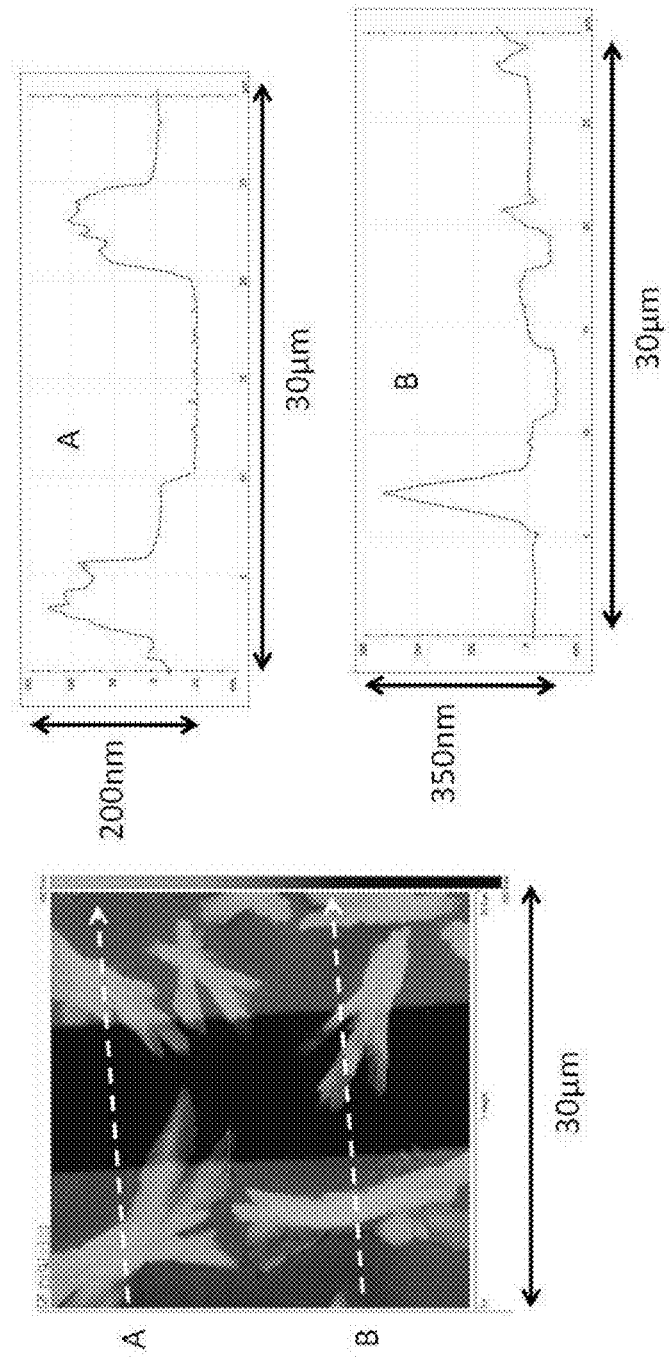
FIG. 6 illustrates height profiles of the thickness profiles of cross sections of a comparative device.

With reference to FIG. 6, cross-sections through A and B of the organic semiconductor layer extending across the source and drain electrodes and the channel of a Comparative Device show peaks in areas over the source and drain electrodes where crystals of the small molecule organic semiconductor are concentrated, indicating that a substantial proportion of the small molecule organic semiconductor crystals grow in a vertical direction, rather than in a lateral direction between the source and drain electrodes. Without wishing to be bound by any theory, it is believed that relatively low mobility of the Comparative Device is attributable at least in part to vertical rather than lateral crystal growth.

Without wishing to be bound by any theory, it is believed that the material used for modification of the source and drain electrodes (in this case pentafluorobenzenethiol) acts as a nucleation site at which the small molecule organic semiconductor preferentially nucleates, resulting in nucleation and crystal growth during solvent evaporation that is centred over the source and drain electrodes.

Consequently, the concentration of the organic semiconductor in the channel region is low, and mobility is relatively poor.

In this example, the material used for modification of the source and drain electrodes is believed to provide a preferential nucleation site due to attraction of the small molecule organic semiconductor towards the pentafluorophenyl group of the source and drain electrodes, however it will be appreciated that this effect may be observed in the absence of an electrode modification material, for example if other materials or surface features provide a preferential nucleation site.

Figure 5:
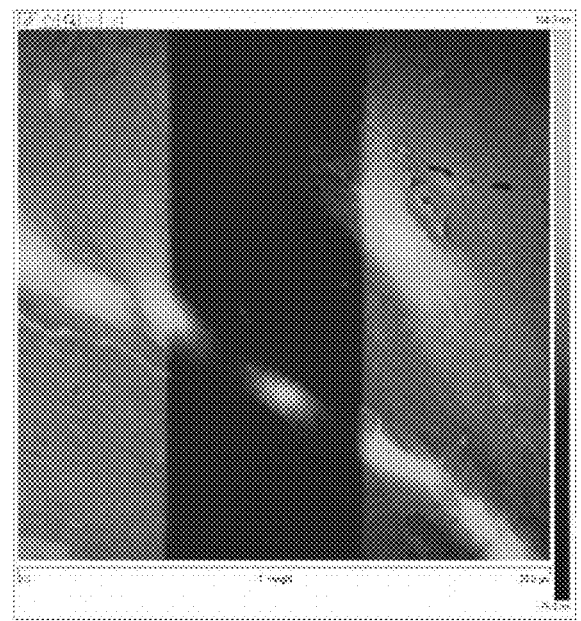
FIG. 5 is an Atomic Force Microscopy image of the organic semiconductor layer of an Exemplary Device.

Referring now to FIG. 5, small molecule organic semiconductor crystals in the organic semiconductor layer of the device examples are more evenly distributed than in the organic semiconductor layer of the Comparative Device of FIG. 4. Without wishing to be bound by any theory, it is believed that the presence of a small molecule crystallisation modifier promotes more uniform crystal growth in the organic semiconductor layer, and that the more evenly distributed crystals that result reduces the risk of formation of relatively low mobility regions within the channel.

Figure 7:
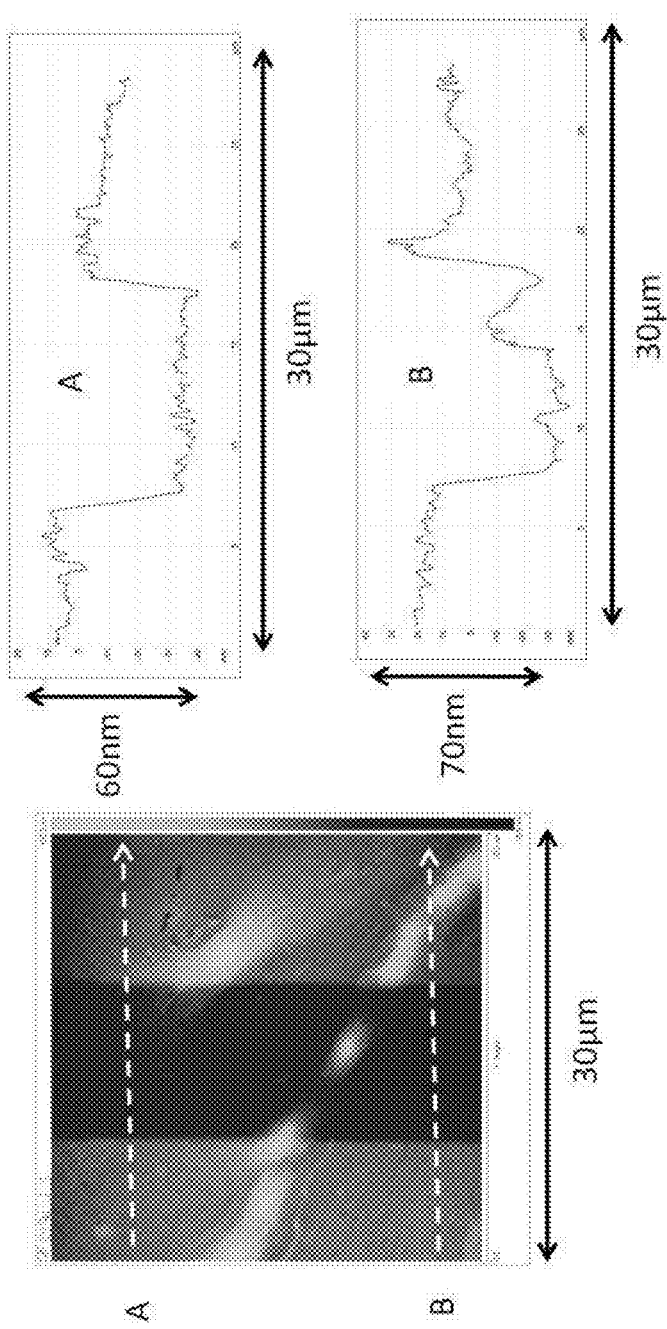
FIG. 7 illustrates thickness profiles of cross sections of an exemplary device according to an embodiment of the invention.

With reference to FIG. 7, cross-sections through A and B of the organic semiconductor layer extending across the source and drain electrodes and the channel of a device according to an embodiment of the invention show much greater uniformity of organic semiconductor layer thickness than the Comparative Device; the main changes in height of the height profile are at the boundary between the source and drain electrodes and the channel.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising at least one solvent, a first small molecule organic semiconductor and a small molecule crystallization modifier, wherein the small molecule organic semiconductor and small molecule crystallization modifier are structurally different from each other, the small molecule crystallization modifier is a second small molecule organic semiconductor, and the small molecule organic semiconductor and small molecule crystallization modifier each have a formula according to any of formulae (VI)-(X):

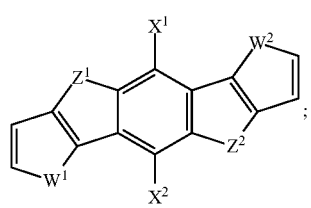

(VI)

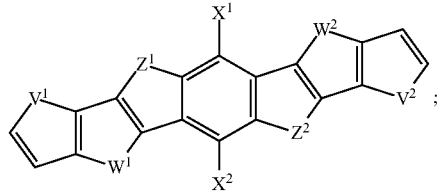

(VII)

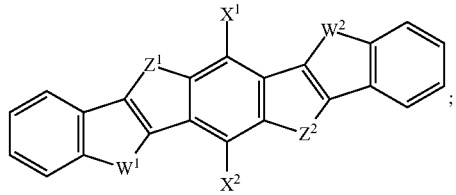

V(III)

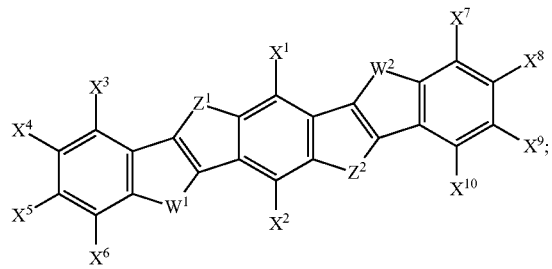

(IX)

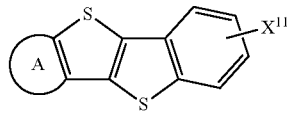

(X)

wherein each $X^1$-$X^{11}$ may be the same or different and are selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups that may be unsubstituted or substituted with one, two or three alkyl groups having from 1 to 8 carbon atoms, silylethynyl groups that may be unsubstituted or substituted with one, two or three alkyl groups having from 1 to 8 carbon atoms and alkenyl groups having from 2 to 12 carbon atoms;

$Z^1$ and $Z^2$ are independently S, O, Se or $NR^4$;

$W^1$ and $W^2$ are independently S, O, Se, $NR^4$ or —$CR^4$=$CR^4$;

$V^1$ and $V^2$ are independently S, O, Se or $NR^5$;

where $R^4$ and $R^5$ are independently H or a substituent selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms; and A is a phenyl group or a thiophene group, said phenyl group or thiophene group optionally being fused with a phenyl group or a thiophene group which can optionally be fused with a group selected from a phenyl group, a thiophene group and a benzothiophene group, any of said phenyl, thiophene and benzothiophene groups being unsubstituted or substituted with at least one group of formula $X^{11}$.

2. A composition according to claim 1 wherein the composition further comprises a polymer.

3. A composition according to claim 2 wherein the polymer comprises a repeat unit of formula (XI):

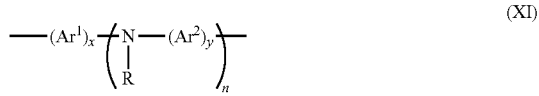

wherein $Ar^1$ and $Ar^2$ in each occurrence are independently selected from substituted or unsubstituted aryl or heteroaryl groups, n is greater than or equal to 1, R in each occurrence is H or a substituent, and x and y are each independently 1, 2 or 3.

4. A composition according to claim 2 wherein the polymer comprises a repeat unit of formula (XII):

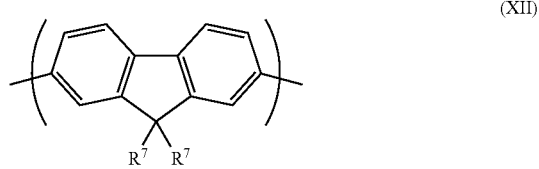

wherein the two groups $R^7$, which may be the same or different, are each H or a substituent and wherein the two groups $R^7$ may be linked to form a ring.

5. A composition according to claim 1 wherein the first small molecule organic semiconductor has formula (X):

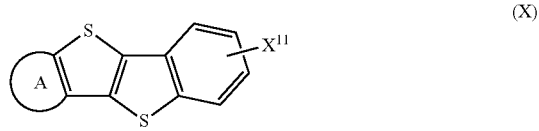

wherein A is a phenyl group or a thiophene group, said phenyl group or thiophene group optionally being fused with a phenyl group or a thiophene group which can optionally be fused with a group selected from a phenyl group, a thiophene group and a benzothiophene group, any of said phenyl, thiophene and benzothiphene groups being unsubstituted or substituted with at least one group of formula $X^{11}$; and each group $X^{11}$ may be the same or different and is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups that may be unsubstituted or substituted with one, two or three alkyl groups having from 1 to 8 carbon atoms, silylethynyl groups that may be unsubstituted or substituted with one, two or three alkyl groups having from 1 to 8 carbon atoms and alkenyl groups having from 2 to 12 carbon atoms.

6. A composition according to claim 1 wherein the small molecule crystallization modifier is a compound having a core that is the same as the first small molecule organic semiconductor and wherein one or more of at least one substituent, substituent position and number of substituents of the small molecule crystallization modifier differs from at least one substituent, substituent position and number of substituents of the first small molecule organic semiconductor.

7. A composition according to claim 1 wherein the first small molecule organic semiconductor:small molecule crystallization modifier weight ratio is at least 2:1.

8. A method of forming an organic thin-film transistor comprising a source electrode and a drain electrode defining a channel region therebetween; an organic semiconductor layer extending across the channel region and in electrical contact with the source and drain electrodes; a gate electrode; and a gate dielectric between the gate electrode and the organic semiconductor layer and the source and drain electrodes, the method comprising the step of forming an organic semiconductor layer of the organic thin-film transistor by depositing a composition according to claim 1 and evaporating the at least one solvent.

9. A method according to claim 8 further comprising modifying at least part of the surface of the source and drain electrodes prior to deposition of the composition.

10. A method according to claim 9 wherein the modifying step comprises binding an organic material to at least part of the surface of the source and drain electrodes wherein the organic material has formula (XIII):

wherein Bind represents a binding group; Sp represents a spacer group; z is 0 or 1; and Org is an organic group.

11. A method according to claim 8 further comprising binding a silane to a surface of the channel region prior to deposition of the composition.

12. A composition according to claim 1 wherein the small molecule crystallization modifier has formula (X).

13. A composition according to claim 1, wherein the small molecule organic semiconductor has formula (X) and wherein the small molecule crystallization modifier has formula (X).

14. An organic thin-film transistor comprising a source electrode and a drain electrode defining a channel region therebetween, an organic semiconductor layer extending across the channel region and in electrical contact with the source and drain electrodes; a gate electrode; and a gate dielectric between the gate electrode and the organic semiconductor layer and the source and drain electrodes, wherein the organic semiconductor layer comprises a first small molecule organic semiconductor and a small molecule crystallization modifier, wherein the small molecule organic semiconductor and small molecule crystallization modifier are structurally different from each other, the small molecule crystallization modifier is a second small molecule organic semiconductor, and the small molecule organic semiconductor and small molecule crystallization modifier each have a formula according to any of formulae (VI)-(X):

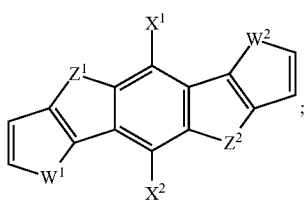
(VI)

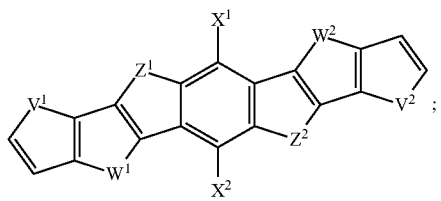
(VII)

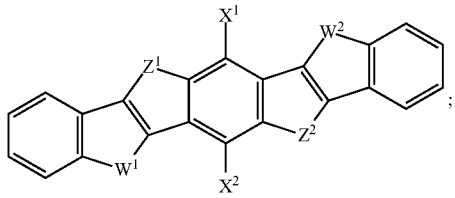
(VIII)

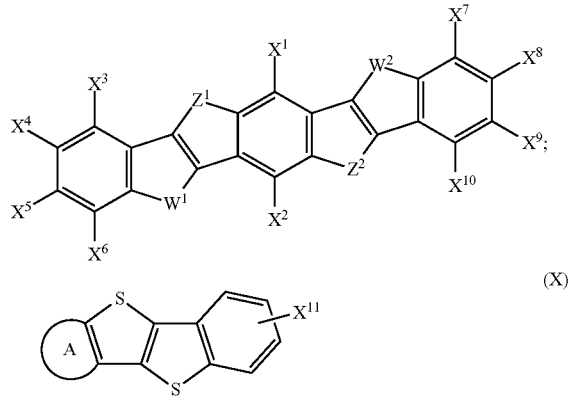
(IX)

(X)

wherein each $X^1$-$X^{11}$ may be the same or different and are selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups that may be unsubstituted or substituted with one, two or three alkyl groups having from 1 to 8 carbon atoms, silylethynyl groups that may be unsubstituted or substituted with one, two or three alkyl groups having from 1 to 8 carbon atoms and alkenyl groups having from 2 to 12 carbon atoms;

$Z^1$ and $Z^2$ are independently S, O, Se or $NR^4$;

$W^1$ and $W^2$ are independently S, O, Se, $NR^4$ or —$CR^4$=$CR^4$;

$V^1$ and $V^2$ are independently S, O, Se or $NR^5$;

where $R^4$ and $R^5$ are independently H or a substituent selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms; and A is a phenyl group or a thiophene group, said phenyl group or thiophene group optionally being fused with a phenyl group or a thiophene group which can optionally be fused with a group selected from a phenyl group, a thiophene group and a benzothiophene group, any of said phenyl, thiophene and benzothiophene groups being unsubstituted or substituted with at least one group of formula $X^{11}$.

15. An organic thin-film transistor according to claim 14 wherein the organic semiconductor layer further comprises a polymer.

16. An organic thin-film transistor according to claim 14 wherein an organic material is bound to at least part of the surface of the source and drain electrodes, the organic material having formula (XIII):

$$\text{Bind-(Sp)}_z\text{-Org} \qquad \text{(XIII)}$$

wherein Bind represents a binding group; Sp represents a spacer group; z is 0 or 1; and Org is an organic group.

17. An organic thin-film transistor according to claim 14 wherein a silane is bound to a surface of the channel region.

* * * * *